United States Patent
Jin et al.

(10) Patent No.: US 7,112,975 B1
(45) Date of Patent: Sep. 26, 2006

(54) ADVANCED PROBE CARD AND METHOD OF FABRICATING SAME

(75) Inventors: Bo Jin, Campbell, CA (US); James E. Nulty, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/784,566

(22) Filed: Feb. 23, 2004

Related U.S. Application Data

(60) Provisional application No. 60/457,885, filed on Mar. 26, 2003.

(51) Int. Cl.
*G01R 31/02* (2006.01)
(52) U.S. Cl. ..................................... 324/754
(58) Field of Classification Search ............... 324/754, 324/756–758, 761, 158.1, 73.1, 765; 438/14–18; 439/44–45, 54, 68, 482
See application file for complete search history.

(56) References Cited

U.S. PATENT DOCUMENTS

| | | | |
|---|---|---|---|
| 5,061,033 A | | 10/1991 | Richard |
| 5,807,767 A | | 9/1998 | Stroupe |
| 6,064,213 A | | 5/2000 | Khandros et al. |
| 6,074,904 A | * | 6/2000 | Spikes et al. ............... 438/223 |
| 6,146,970 A | * | 11/2000 | Witek et al. ................ 438/424 |
| 6,208,947 B1 | * | 3/2001 | Beffa ............................ 438/14 |
| 6,400,173 B1 | | 6/2002 | Shimizu et al. |
| 6,452,411 B1 | * | 9/2002 | Miller et al. ................ 324/765 |
| 6,483,330 B1 | * | 11/2002 | Kline ........................... 324/754 |
| 6,509,213 B1 | * | 1/2003 | Noble .......................... 438/149 |
| 6,527,563 B1 | | 3/2003 | Clayton |
| 6,531,335 B1 | | 3/2003 | Grigg |
| 6,559,666 B1 | | 5/2003 | Bernier et al. |
| 6,563,173 B1 | * | 5/2003 | Bolam et al. ................ 257/349 |
| 6,627,484 B1 | * | 9/2003 | Ang ............................. 438/154 |
| 6,627,954 B1 | * | 9/2003 | Seefeldt ....................... 257/350 |
| 6,753,238 B1 | * | 6/2004 | Kurita .......................... 438/459 |
| 6,759,865 B1 | * | 7/2004 | Gu et al. ..................... 324/765 |
| 6,774,395 B1 | * | 8/2004 | Lin et al. ........................ 438/18 |
| 6,847,218 B1 | * | 1/2005 | Nulty et al. ................. 324/754 |
| 6,849,928 B1 | * | 2/2005 | Cha et al. .................... 257/647 |
| 6,912,778 B1 | * | 7/2005 | Ahn et al. ..................... 29/852 |
| 2005/0037534 A1 | * | 2/2005 | Sawyer ......................... 438/84 |

OTHER PUBLICATIONS

Bengtsson et al, Interface charge control of directly bonded silicon structures, Aug. 1, 1989, Journal of Applied Physics, vol. 66, 1231-1239.*

* cited by examiner

*Primary Examiner*—Jermele Hollington
(74) *Attorney, Agent, or Firm*—Okamoto & Benedicto LLP

(57) ABSTRACT

In one embodiment, an anti-wafer structure includes a silicon on insulator (SOI) layer and a plurality of probe dice formed on the SOI layer. Each of the probe die may have a pad layout corresponding to a pad layout of a die on a wafer under test. A plurality of holes may extend through the SOI layer and the plurality of probe dice, with each hole corresponding to a pad on a probe die. The anti-wafer structure may be advantageously used in an advanced probe card. Techniques for fabricating an anti-wafer and an advanced probe card are also disclosed.

16 Claims, 7 Drawing Sheets

ADVANCED PROBE CARD AND METHOD OF FABRICATING SAME

CROSS-REFERENCE TO RELATED APPLICATION

This application claims the benefit of U.S. Provisional Application No. 60/457,885, entitled "Method and Apparatus for Advanced Probe Card," filed on Mar. 26, 2003 by Bo Jin and James E. Nulty, which is incorporated herein by reference in its entirety.

BACKGROUND OF THE INVENTION

1. Field of the Invention

The present invention relates generally to integrated circuits, and more particularly but not exclusively to methods and apparatus for testing integrated circuits.

2. Description of the Background Art

Probe cards are used in the testing of integrated circuits by providing an interface between the pads of a bare die or chip and the test equipment. Most probe cards are configured with probe pins that have tips including hard materials so that they can be repeatedly used to test different chips. Typical probe cards are commonly configured to be connected to only one chip at a time. So, where a wafer may contain hundreds of individual chips, only one chip location at a time could be tested using this approach.

Another disadvantage of this conventional approach is that the wafer itself typically receives some damage from the probe tip touch down. If there is substantial misalignment, some chips can be destroyed in this way.

SUMMARY

In one embodiment, an anti-wafer structure includes a silicon on insulator (SOI) layer and a plurality of probe dice formed on the SOI layer. Each of the probe die may have a pad layout corresponding to a pad layout of a die on a wafer under test. A plurality of holes may extend through the SOI layer and the plurality of probe dice, with each hole corresponding to a pad on a probe die. The anti-wafer structure may be advantageously used in an advanced probe card. Techniques for fabricating an anti-wafer and an advanced probe card are also disclosed.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention relates to an advanced probe card with an anti-wafer structure. Advanced probe cards and anti-wafer structures are also disclosed in U.S. application Ser. No. 10/144,676, now U.S. Pat. No. 6,847,218 and Ser. No. 10/209,088, now U.S. Pat. No. 6,759,865, which are incorporated herein by reference in their entirety.

Figure 1:
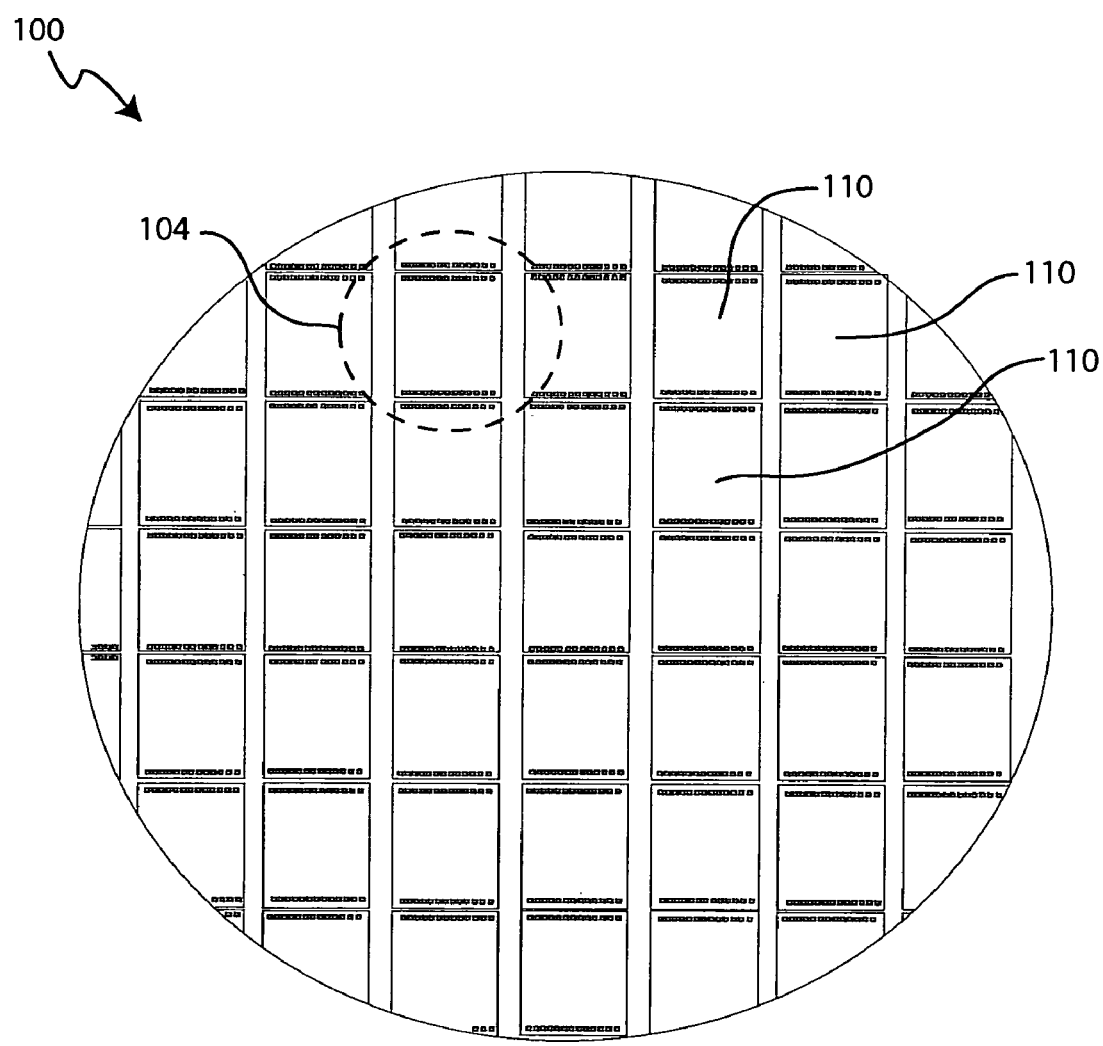
FIG. 1 schematically shows an anti-wafer in accordance with an embodiment of the present invention.

FIG. 1 schematically shows an anti-wafer 100 in accordance with an embodiment of the present invention. Anti-wafer 100 may include a plurality of probe dice 110, only a few of which are labeled in FIG. 1 in the interest of clarity. Each probe die 110 is a mirror image of a die on an uncut wafer being tested. Anti-wafer 100 may serve as a probe of an advanced probe card. In other words, anti-wafer 100 provides an interface between the test equipment (also referred to as a "tester") and the wafer under test. FIG. 1 shows the probe side of anti-wafer 100, which is the side facing the wafer under test. The other side of anti-wafer 100 faces the tester. As will be more apparent below, the probe side of anti-wafer 100 may touch down on a wafer under test using a removable electrical connection, such as a vertical elastomer. This advantageously allows testing of several dies in one touch down, thereby increasing the throughput of the test process. Furthermore, because probe dice 110 are mirror images of dice under test, probe dice 110 are relatively easy to line up for testing.

Figure 2:
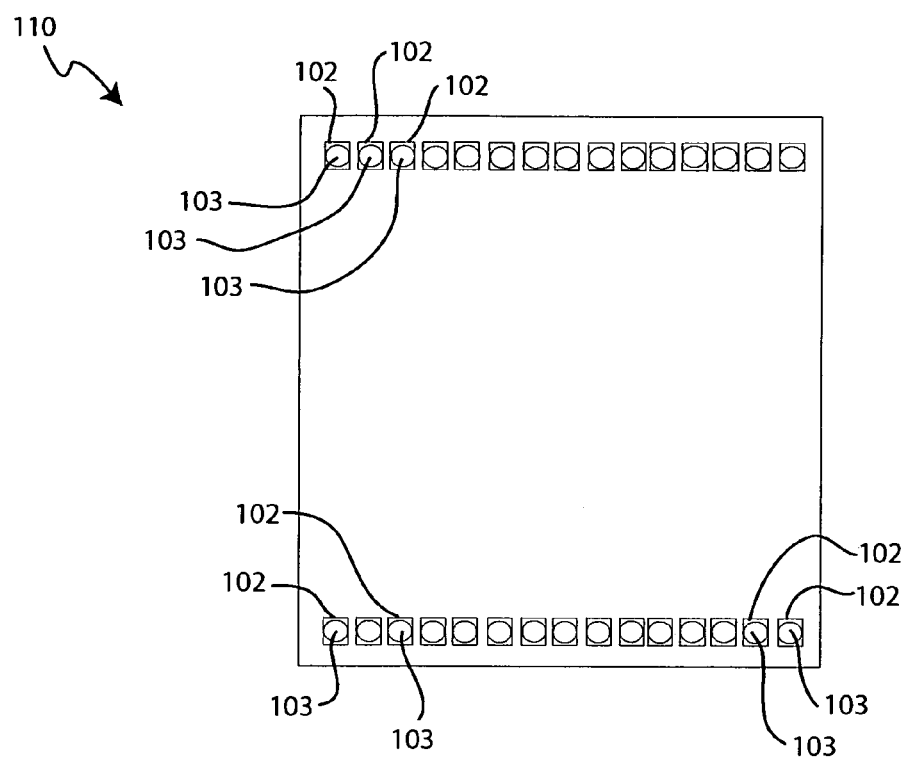
FIG. 2 schematically shows a probe die in accordance with an embodiment of the present invention.

FIG. 2 schematically shows a probe die 110 in accordance with an embodiment of the present invention. The probe die shown in FIG. 2 may be the one bounded by dashed circle 104 shown in FIG. 1. As shown in FIG. 2, a probe die 110 may include a plurality of pads 102. In one embodiment, each pad 102 is aligned with a corresponding pad on a die of a wafer under test. For example, if a die being tested has 100 pads, a probe die 110 may also have 100 pads that are aligned with the pads of the die. However, a probe die 110 does not necessarily have to have the same number of pads as the die. That is, in some cases, some pads on a die may not be testable. In those cases, a probe die 110 may only have pads 102 that are aligned with the testable pads.

Pads 102 provide an electrically conductive surface on the probe side of an anti-wafer 100. Pads 102 may be coupled to circuitry in the anti-wafer 100 or directly to terminals or other pads on the tester side of the anti-wafer. A pad 102 may have a hole through which an interconnect line 103 may be formed. An interconnect line 103 may comprise an electrically conductive material for connecting a pad 102 to circuitry in the anti-wafer or to another node, such as other terminals or pads.

Figure 3:
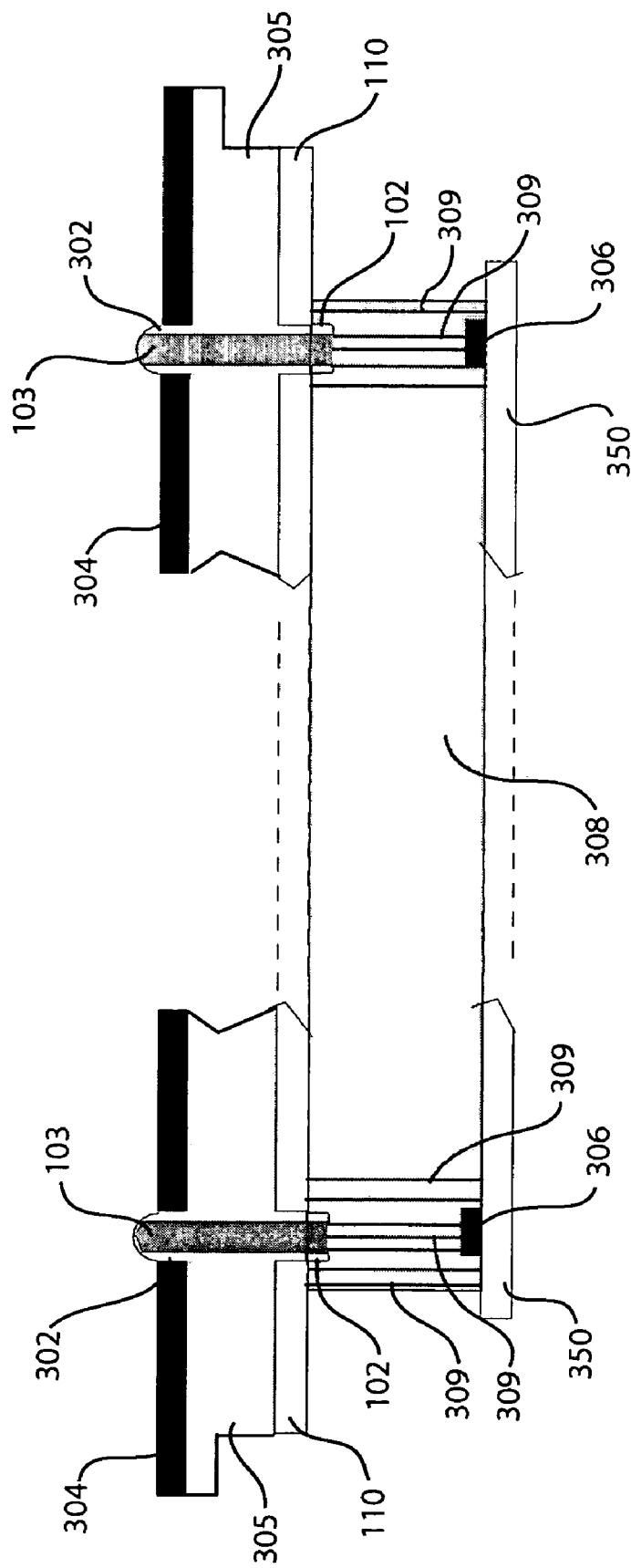
FIG. 3 schematically shows a cross-sectional view of an advanced probe card in accordance with an embodiment of the present invention.

FIG. 3 schematically shows a cross-sectional view of an advanced probe card in accordance with an embodiment of the present invention. The advanced probe card may comprise an anti-wafer 110, a ceramic disk 305, and a printed circuit board (PCB) 304. Anti-wafer 100, ceramic disk 305, and PCB 304 may be glued or bonded together, for example.

Other means of holding the aforementioned components of the advanced probe card together may also be employed without detracting from the merits of the present invention. The use of an anti-wafer, disk, and PCB advantageously allows the advanced probe card to be relatively thin and compact, thereby reducing parasitic effects, such as wire inductance, between the tester and the wafer under test.

The advanced probe card may be used in conjunction with a vertical elastomer 308 to test the dice of a wafer 350. Elastomer 308 comprises a plurality of vertically oriented electrically conductive connectors 309. Note that only some connectors 309 are labeled in FIG. 3 to avoid cluttering the figure. When elastomer 308 is compressed between anti-wafer 110 and wafer 350, connectors 309 make an electrical connection between pads 102 of anti-wafer 110 and corresponding pads 306 of wafer 350. By providing a compressible and relatively smooth connection, elastomer 308 minimizes damage to wafer 350. Elastomer 308 may be permanently attached to anti-wafer 110 using a high-temperature adhesive, for example. Elastomer 308 may also be manually placed between anti-wafer 110 and wafer 350 just prior to testing.

Figure 4:
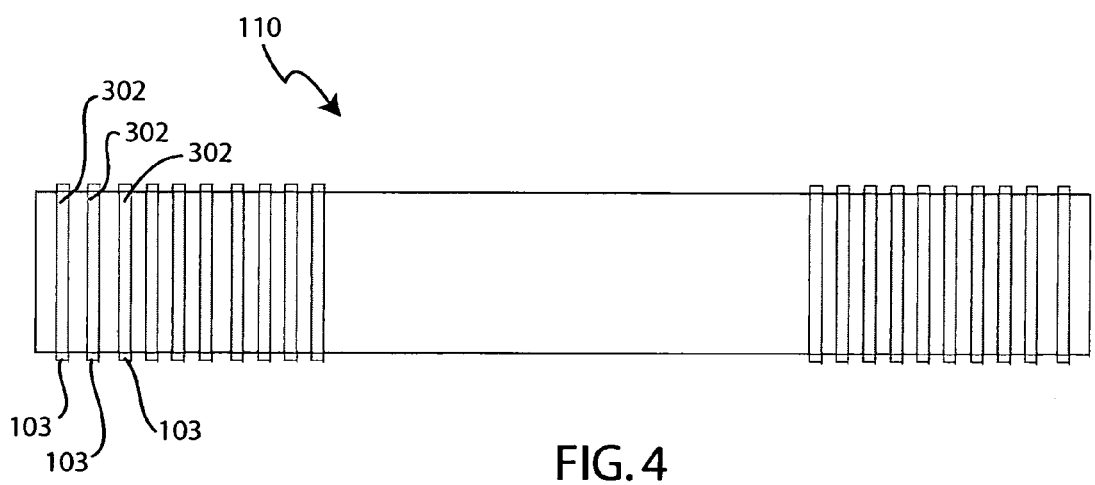
FIG. 4 shows a cross-sectional view of an anti-wafer in accordance with an embodiment of the present invention.

Ceramic disk 305 provides heat insulation between PCB 304 and anti-wafer 110. Ceramic disk 305 advantageously allows the advanced probe card to operate at relatively high temperature test environments. Holes 302 through anti-wafer 110, ceramic disk 305, and PCB 304 allow interconnect lines 103 to couple pads 102 to the side of PCB 304 facing the tester (not shown). Lines 103 may comprise wires, for example. In that case, lines 103 may be soldered on terminals, connectors, pads, or other nodes on the tester side of PCB 304. Cables (not shown) from the tester may be connected to lines 103 by way of a soldered connection or removable connector on PCB 104, for example. This allows the tester to send and receive signals to and from wafer 350. The advanced probe card may have a plurality of holes 302. For example, as shown in the cross-sectional view of FIG. 4, anti-wafer 110 may have several holes 302 for accommodating interconnect lines 103. A hole 302 through anti-wafer 110, ceramic disk 305, and PCB 304 advantageously allows for a relatively short interconnect line 103. This minimizes parasitic effects on the interconnect line.

Figure 5:
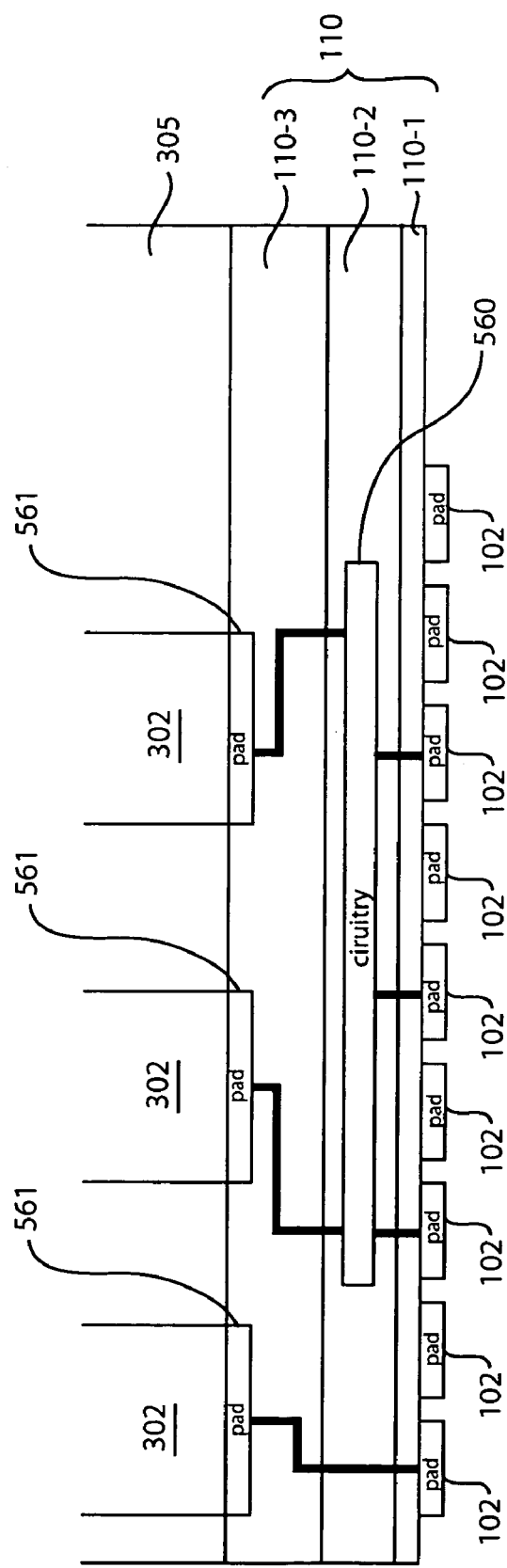
FIG. 5 shows a portion of an advanced probe card in accordance with an embodiment of the present invention.

In the example of FIG. 3, pads 102 are directly coupled to the other side of anti-wafer 110. However, pads 102 may also be coupled to circuitry within anti-wafer 110. FIG. 5 shows a portion of an advanced probe card in accordance with an embodiment of the present invention. In the example of FIG. 5, anti-wafer 110 comprises an isolation layer 110-1, a first level 110-2, and a second level 110-3. Isolation layer 110-1 may be an oxide layer (e.g., silicon on insulator layer), for example. A level of anti-wafer 110 may include electrical circuitry, such as circuit 560 in level 110-2. Circuit 560 advantageously allows off-loading of some test or signal conditioning functions to anti-wafer 110. For example, circuit 560 may be configured to include buffer and driver circuits to condition signals coming from or being transmitted to wafer 350. As another example, circuit 560 may be similar to the BIST (built-in self-test) portion of a die under test. Note that because anti-wafer 110 may comprise silicon, conventional semiconductor fabrication techniques may be employed to incorporate circuitry in the anti-wafer.

Still referring to FIG. 5, level 110-3 may be an "adapter layer" for adopting the layout of pads 102 (which mirrors the layout of the pads of the wafer under test) to another layout that is more suitable for connecting to larger wirings, such as cables leading to the tester, for example. Note that adapting the layout of pads 102 to another layout may also be done on a single level. For example, pads 561 may be on level 110-2. In the example of FIG. 5, pads 102 are coupled to larger pads 561. This is especially advantageous in applications where pads 102 are closely spaced together and not all of them are employed during test. Interconnect lines 103 in holes 302 are not shown in FIG. 5 in the interest of clarity.

Figure 6:
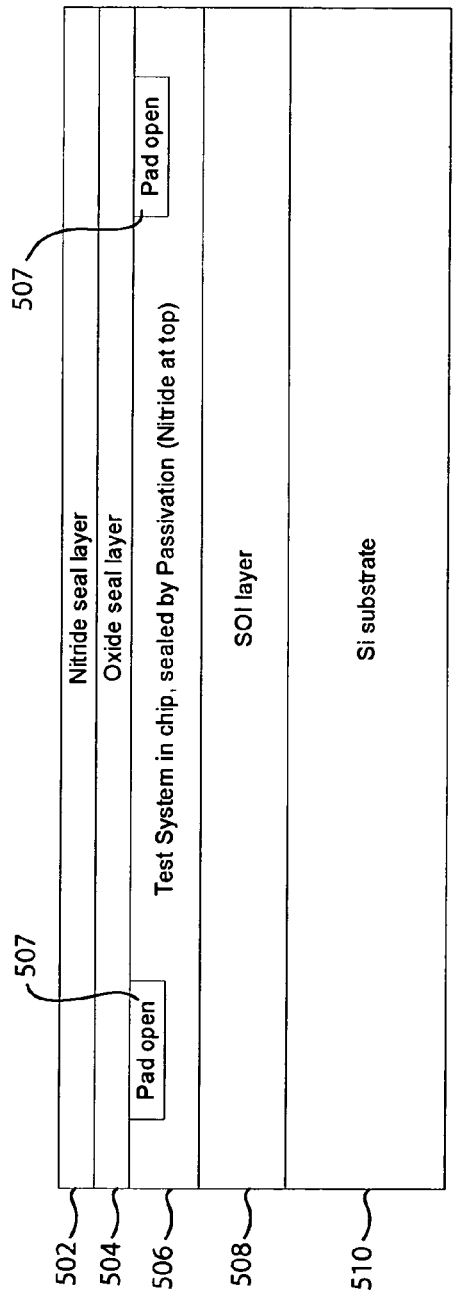
FIGS. 6–11 systematically illustrate the fabrication of an anti-wafer in accordance with an embodiment of the present invention The use of the same reference label in different drawings indicates the same or like components. Drawings are not necessarily to scale unless otherwise noted.

FIGS. 6–11 systematically illustrate the fabrication of an anti-wafer in accordance with an embodiment of the present invention. Referring to FIG. 6, a silicon substrate 510, a silicon on insulator (SOI) layer 508, and a chip 506 may form a silicon on insulator structure. In that case, SOI layer 508 may be an oxide layer, while chip 506 may comprise silicon in which integrated circuits and pads 102 may be fabricated. The use of a silicon on insulator structure advantageously minimizes parasitic effects, thereby allowing the anti-wafer to operate at relatively high speeds. Furthermore, the silicon on insulator structure advantageously isolates the probe side of the anti-wafer from the other components of the advanced probe cards, and isolates the pins/pads of the anti-wafer from each other. Note that only one chip 506 is shown on the figures for clarity of illustration. It should be noted that there may be several chips 506 on SOI layer 508, with each chip 506 serving as a probe die.

In the example of FIG. 6, pad openings 507 represent etched portions of chip 506. Pad openings 507 may be formed during a pad open etch step to allow conductors to be coupled to the chip during packaging. In the present embodiment, pad openings 507 are not filled-in with a conductive material in this step. To protect pad openings 507 during subsequent processing of the anti-wafer, a silicon dioxide seal layer 504 and a silicon nitride seal layer 502 are formed over the pad openings.

Figure 7:
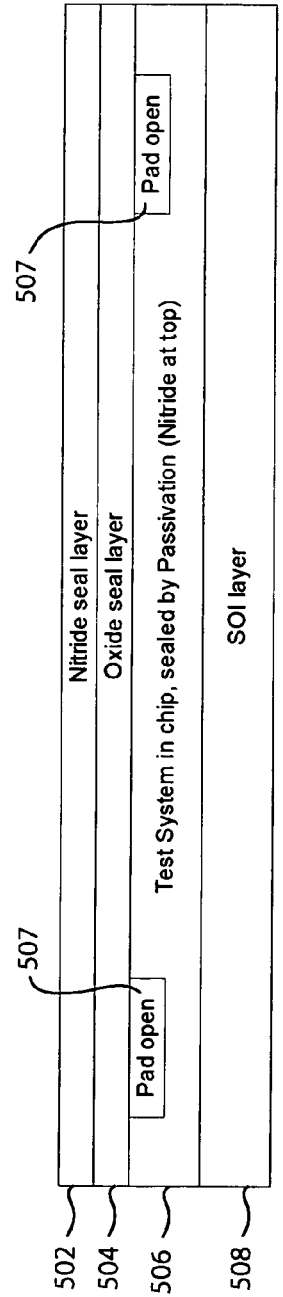

In FIG. 7, substrate 510 is removed to expose SOI layer 508. In one embodiment where substrate 510 is a silicon substrate, substrate 510 may be removed using a backside polish step. The sample of FIG. 7 may be subjected to an HF dip process to clean the surface of an oxide SOI layer 508 after the polishing step. The HF dip process may remove some of SOI layer 508. For example, about 10 Angstroms to about 500 Angstroms of oxide may be removed from SOI layer 508 by the HF dip process.

Figure 8:
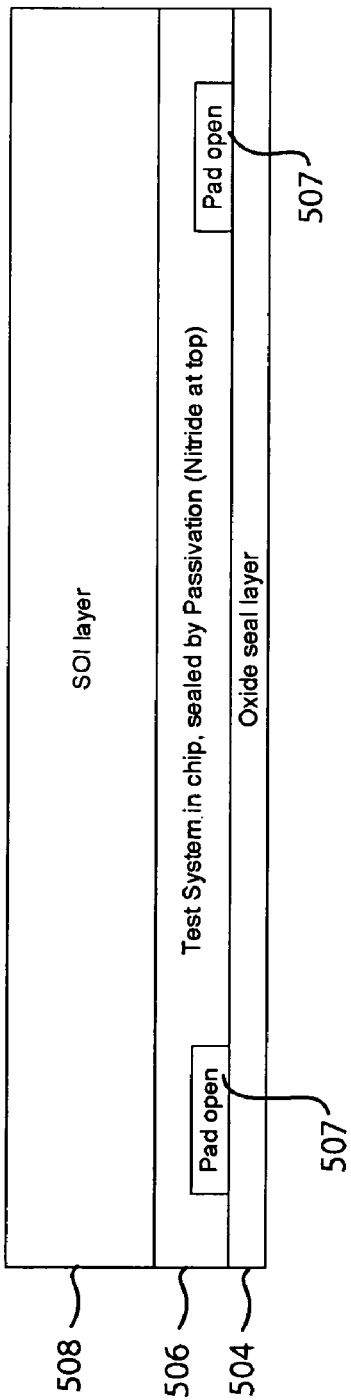

In FIG. 8, which shows the sample as being turned over, additional oxides are deposited on SOI layer 508 to compensate for the ones that may have been removed in the HF dip process. Nitride seal layer 502 is then removed.

Figure 9:
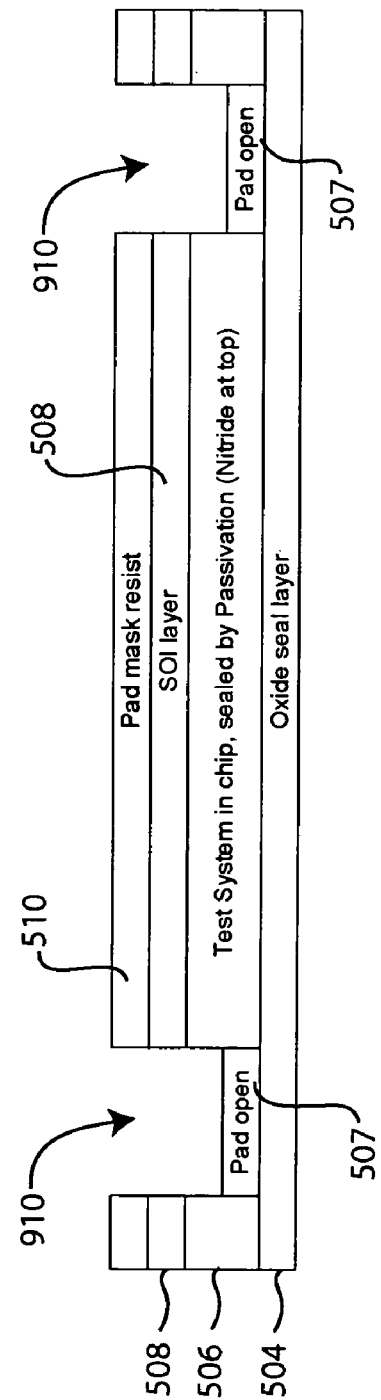

In FIG. 9, a pad mask resist 510 is formed over SOI layer 508. Pad mask resist 510 provides a pattern for etching through pad openings 507. SOI layer 508 and chip 506 are then etched through pad openings 507. This forms openings 910 from pad mask resist 510, through SOI layer 508, and through chip 506. Only oxide seal layer 507 blocks openings 910 in FIG. 9.

Figure 10:
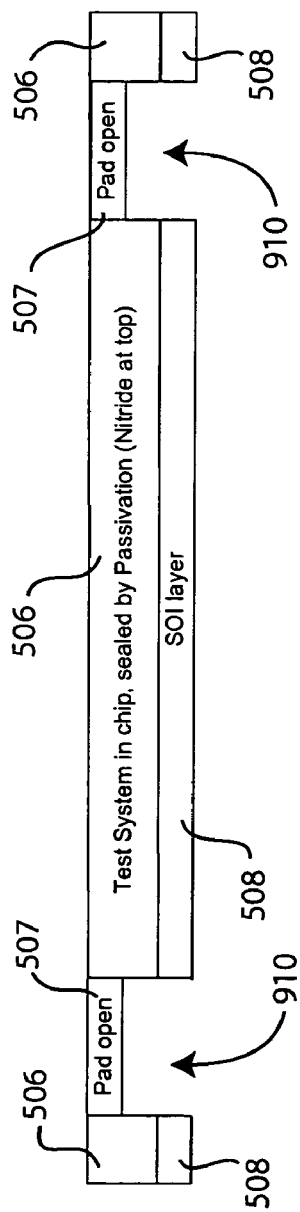
Figure 11:
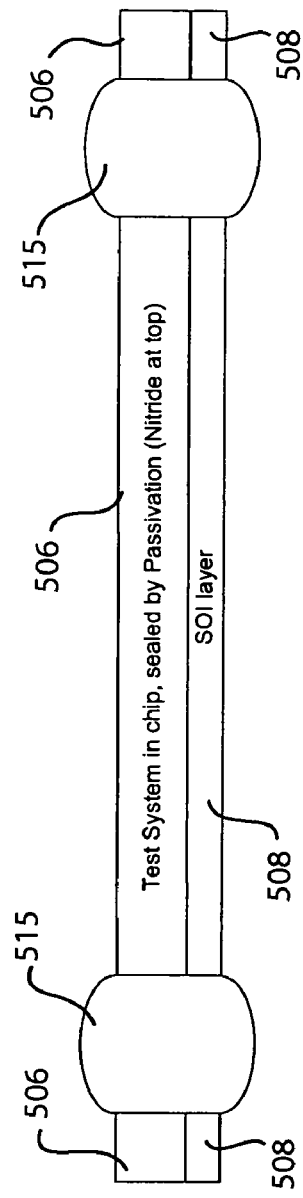

In FIG. 10, oxide seal layer 504 and pad mask resist 510 are removed. Removal of oxide seal layer 504 exposes chip 506. Viewing the sample of FIG. 10 right side up, chip 506 is on SOI layer 508 with openings 910 through them. That is, openings 910 may serve as contact holes through chip 506. (Note that pad openings 507 are openings through chip 506.) In FIG. 11, a bump process is used to form electrically conductive connections 515 through chip 506. Connections 515 may be part of interconnect lines 103 (see FIG. 3), for example. The sample of FIG. 11 may be used as anti-wafer in an advanced probe card, such as that shown in FIG. 3. While designed for a probe card in this example, the just described process could also be used in stacked-die packaging configurations or in pressure sensors, for example.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An anti-wafer structure for testing a plurality of dice on a wafer under test, the structure comprising:
    a silicon on insulator (SOI) layer;
    a plurality of probe dice formed on the SOI layer, each probe die in the plurality of probe dice having a pad layout corresponding to a pad layout of a die on the wafer under test;
    a plurality of holes, each of the holes extending through the SOI layer and a probe die in the plurality of probe dice, the holes corresponding to pads on the plurality of probe dice;
    wherein the holes are filed with interconnect lines coupled to form electrical connections on either side of the anti-wafer structure.

2. The anti-wafer structure of claim 1 wherein the interconnect lines are coupled to pads of the wafer under test.

3. The anti-wafer structure of claim 1 wherein a number of the probe dice equals a number of dice on the wafer under test.

4. The anti-wafer structure of claim 1 wherein the SOI layer comprises an oxide layer.

5. A method of fabricating an anti-wafer, comprising:
    providing a substrate, a silicon on insulator (SOI) layer over the substrate, and a silicon layer over the SOI layer;
    forming a seal layer over the silicon layer;
    removing the substrate using a polishing process;
    forming an opening through the SOI layer and the silicon layer;
    removing the seal layer;
    forming an interconnect line extending through the SOI layer and the silicon layer;
    performing an HF dip process to clean a surface of the SOI layer after the polishing process.

6. The method of claim 5 further comprising:
    depositing an oxide on the SOI layer after the HF dip process.

7. The method of claim 5 wherein the seal layer comprises:
    an oxide layer over the silicon layer; and
    a nitride layer over the oxide layer.

8. The method of claim 5 wherein the silicon layer includes pad openings and the seal layer protects the pad openings during subsequent processing steps.

9. The method of claim 5 wherein the SOI layer comprises silicon dioxide.

10. The method of claim 5 wherein the substrate comprises a silicon substrate.

11. An anti-wafer structure for testing a plurality of dice on a wafer under test, the structure comprising:
    a silicon on insulator (SOI) layer;
    a plurality of probe dice formed on the SOI layer, each probe die in the plurality of probe dice having a pad layout corresponding to a pad layout of a die on the wafer under test; and
    an adapter layer configured to adapt a pad layout of a probe die to another pad layout.

12. The anti-wafer structure of claim 11 further comprising:
    a plurality of holes extending through the SOI layer and the plurality of probe dice, the holes corresponding to pads on the plurality of probe dice.

13. The anti-wafer structure of claim 12 wherein the holes are filed with interconnect lines coupled to form electrical connections on either side of the anti-wafer structure.

14. The anti-wafer structure of claim 13 wherein the interconnect lines are coupled to pads of the wafer under test.

15. The anti-wafer structure of claim 11 wherein a number of the probe dice equals a number of dice on the wafer under test.

16. The anti-wafer structure of claim 11 wherein the SOI layer comprises an oxide layer.

* * * * *